United States Patent
Chauhan et al.

(10) Patent No.: US 9,905,259 B2
(45) Date of Patent: Feb. 27, 2018

(54) IMPRINT TEMPLATE AND METHODS THEREOF

(71) Applicant: Seagate Technology LLC, Cupertino, CA (US)

(72) Inventors: Sundeep Chauhan, Fremont, CA (US); Alexander Kantorov, Dublin, CA (US); Kim Yang Lee, Fremont, CA (US); David Kuo, Palo Alto, CA (US); Rene Johannes Marinus Van de Veerdonk, Pleasanton, CA (US); Barmeshwar Vikaramaditya, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 197 days.

(21) Appl. No.: 14/699,412

(22) Filed: Apr. 29, 2015

(65) Prior Publication Data
US 2015/0302881 A1    Oct. 22, 2015

Related U.S. Application Data

(63) Continuation of application No. 13/097,841, filed on Apr. 29, 2011, now abandoned.

(51) Int. Cl.
| | |
|---|---|
| *G11B 5/17* | (2006.01) |
| *G11B 5/86* | (2006.01) |
| *G11B 5/74* | (2006.01) |
| *G11B 5/855* | (2006.01) |
| *G03F 7/004* | (2006.01) |
| *G11B 5/596* | (2006.01) |
| *G11B 11/03* | (2006.01) |

(52) U.S. Cl.
CPC ............ *G11B 5/865* (2013.01); *G03F 7/0041* (2013.01); *G11B 5/59638* (2013.01); *G11B 5/746* (2013.01); *G11B 5/855* (2013.01); *G11B 11/03* (2013.01)

(58) Field of Classification Search
None
See application file for complete search history.

(56) References Cited

U.S. PATENT DOCUMENTS

| | | | |
|---|---|---|---|
| 8,501,022 B2 * | 8/2013 | Albrecht | B82Y 10/00 216/22 |
| 2005/0094298 A1 * | 5/2005 | Sakurai | B82Y 10/00 360/15 |
| 2006/0104586 A1 * | 5/2006 | Tokushima | B82Y 20/00 385/129 |
| 2007/0120292 A1 | 5/2007 | Hattori et al. | |
| 2007/0211592 A1 * | 9/2007 | Sakurai | B82Y 10/00 369/47.49 |

(Continued)

FOREIGN PATENT DOCUMENTS

JP    2005100499    *   4/2005

*Primary Examiner* — Edmund Lee

(57) ABSTRACT

Provided herein is a method, including forming a first template including a first pattern, wherein forming the first template includes self-assembly of diblock copolymers guided by an initial pattern; forming a second template including a second pattern, wherein the second pattern corresponds to a servo pattern; and forming a master template from the first template, wherein the master template includes one or more portions of the first pattern combined with the second pattern.

16 Claims, 16 Drawing Sheets

FIG. 2B

(56) References Cited

U.S. PATENT DOCUMENTS

| | | | |
|---|---|---|---|
| 2008/0062547 A1 | 3/2008 | Bandic et al. | |
| 2008/0112079 A1* | 5/2008 | Fullerton | G11B 5/855 360/123.02 |
| 2008/0274381 A1* | 11/2008 | Fullerton | G11B 5/65 428/846.3 |
| 2009/0166321 A1* | 7/2009 | Albrecht | B82Y 10/00 216/22 |
| 2009/0196488 A1* | 8/2009 | Nealey | B81C 1/00031 382/145 |
| 2010/0124638 A1 | 5/2010 | Xiao et al. | |
| 2012/0082866 A1* | 4/2012 | Xiao | G11B 5/855 428/831 |
| 2012/0107583 A1* | 5/2012 | Xiao | G03F 7/0002 428/210 |
| 2012/0273999 A1* | 11/2012 | Chauhan | G11B 5/746 264/293 |
| 2014/0004272 A1* | 1/2014 | Kimura | G11B 5/84 427/526 |
| 2014/0099478 A1* | 4/2014 | Yang | B32B 27/06 428/172 |

* cited by examiner

IMPRINT TEMPLATE AND METHODS THEREOF

CROSS-REFERENCE

This application is a continuation of U.S. patent application Ser. No. 13/097,841, filed Apr. 29, 2011, which is incorporated herein by reference in its entirety.

BACKGROUND

In a recording system based on certain patterns, the media is fundamentally different from conventional continuous media, as the magnetic regions are laid out as periodic arrays of dots/islands where the information is stored and the region surrounding the dots is non-magnetic. Current methods to create a patterned master template for making the final media are expensive, create less efficient storage, are time consuming and take months to get results.

SUMMARY

Provided herein is a method, including forming a first template including a first pattern, wherein forming the first template includes self-assembly of diblock copolymers guided by an initial pattern; forming a second template including a second pattern, wherein the second pattern corresponds to a servo pattern; and forming a master template from the first template, wherein the master template includes one or more portions of the first pattern combined with the second pattern.

DRAWINGS

DESCRIPTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the embodiments.

General Overview:

It should be noted that the descriptions that follow, for example, in terms of a method for patterning a stack is described for illustrative purposes and the underlying system can apply to any number and multiple types of bit patterned stack or media. In one embodiment, the manufacturing of a bit patterned stack can be implemented as bit pattered media (BPM). Bit patterned stacks use servo sectors to position the heads. In one embodiment the embedded servo patterns are created using multiple templates that reduce mastering time. In another embodiment multiple PES field pairs are created using incremental position shifts in a cross track direction and used to select the PES field pair that is positioned to avoid partial domain dot noise and produce the highest signal to noise ratio. In one embodiment an efficient method to reduce the time to develop a high quality extendible master imprint template may reduce cost and speed manufacturing of high quality BPM. It should be noted that in the descriptions that follow, the term position error signal is also represented by the capital letters PES which carry the same meaning.

Figure 1:
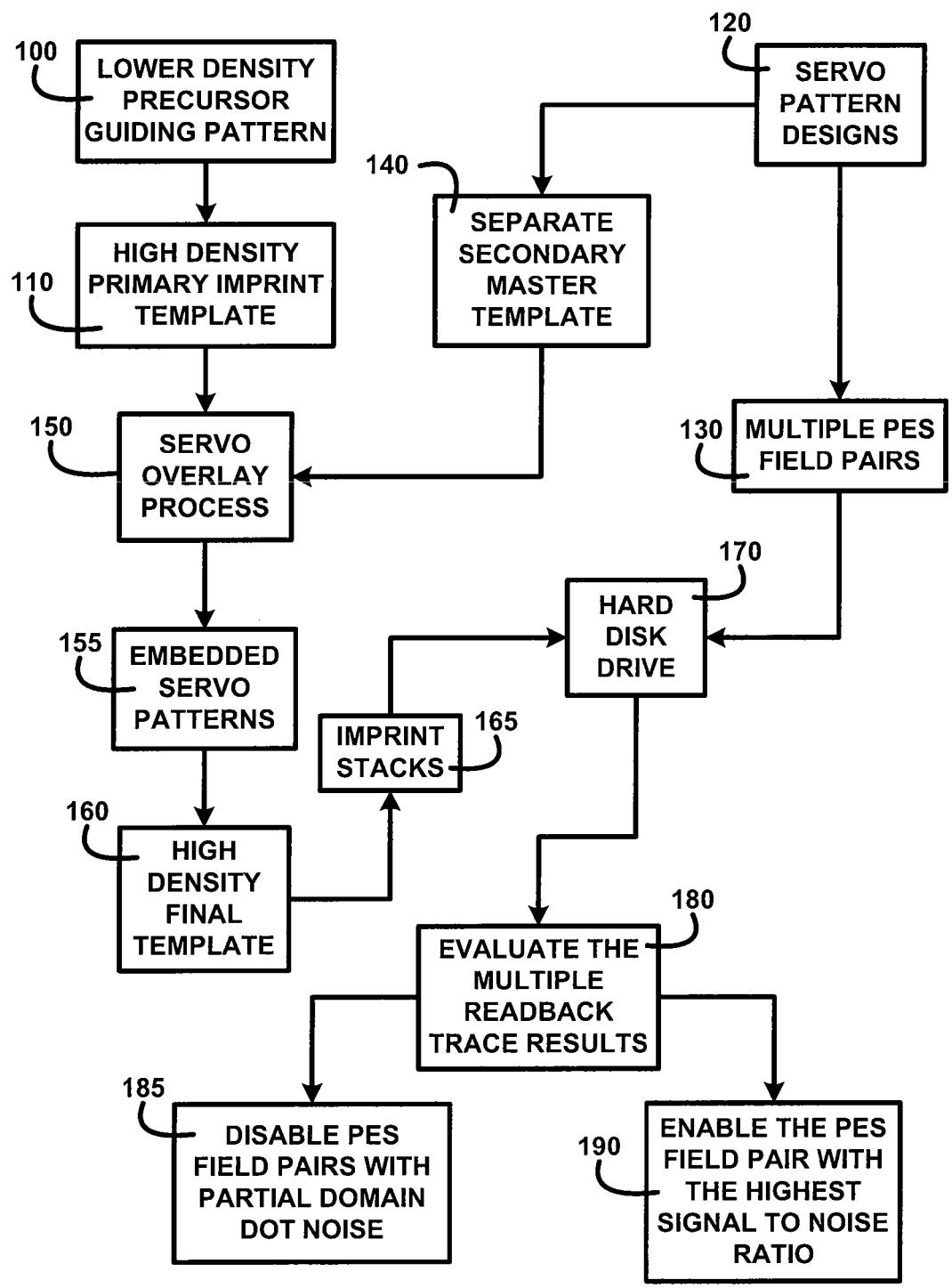
FIG. 1 shows a block diagram of an overview of a method for patterning a stack of one embodiment.

FIG. 1 shows a block diagram of an overview of a method for patterning a stack of one embodiment. FIG. 1 shows a block diagram of an overview of a method for patterning a stack of one embodiment. FIG. 1 shows a method for patterning a stack for bit patterned media creating a lower domain dot density precursor guiding pattern 100 to pattern an entire high density primary master imprint template 110.

The lower domain dot density precursor guiding pattern 100 has a low domain dot density that is very uniform with near perfect symmetry. Patterning an entire high density primary master imprint template 110 using the lower domain dot density precursor guiding pattern 100 reduces mastering time of one embodiment.

The high density primary imprint template 110 is used in a servo overlay process 150. The servo overlay process 150 embeds the servo pattern designs 120 within the high density primary imprint template 110 using a separate secondary master template 140 to form a high density final template 160. The separate secondary master template 140 is created quickly further reducing the mastering time. The process to create the separate secondary master template 140 includes the use of an e-beam writer to position the servo pattern designs 120 on the quartz wafer that is processed to create an etched template. The e-beam writer process includes the calculation and recording of multiple PES field pairs 130.

The multiple PES field pairs 130 are positioned to read burst from the domain dots in the final servo patterns embedded within the stack media. The initial PES field pair is positioned over the servo pattern as it is transmitted to the e-beam writer. Additional PES field pairs are positioned using incremental cross track shifting relative to the initial position.

The high density final template 160 is used to imprint stacks 165. An ion beam etching process kills the magnetic properties of non-servo dots in the servo sectors on the imprinted stacks. The imprinted stacks are processed with DC erasing to realign the magnetic dots in one direction. One or more completed stacks is placed into a hard disk drive 170. The hard disk drive 170 reads the servo bursts from the dot magnetic fields in the servo sector patterned regions and synchronously decodes the PES signals from the servo bursts. The multiple PES field pairs 130 register the PES signal from the domain dot zones in each servo section. The preamble has been locked to the phase locked loop to allow readback data to be read and decoded synchronously with the burst and operation. Each PES field pair is positioned differently along the cross track radial. These multiple locations may or may not have a boundary crossing over one or more domain dot. A readback trace is used to evaluate the multiple readback trace results 180. A readback trace that shows a low signal to noise ratio indicated partial domain dot noise. Partial domain dot noise is an indicator that the boundaries of the PES field pair crosses over one or more domain dot. The evaluation of the readback trace showing a low signal to noise ration may disable PES field pairs with partial domain dot noise 185. The readback trace evaluation may enable the PES field pair with the highest signal to noise ratio 190. The method for patterning a stack reduces mastering time for a master template, is cost effective and provides accurate positioning of the servo pattern guided head for high quality and reliable read operations using a patterned stack such as bit-patterned media.

Figure 2A:
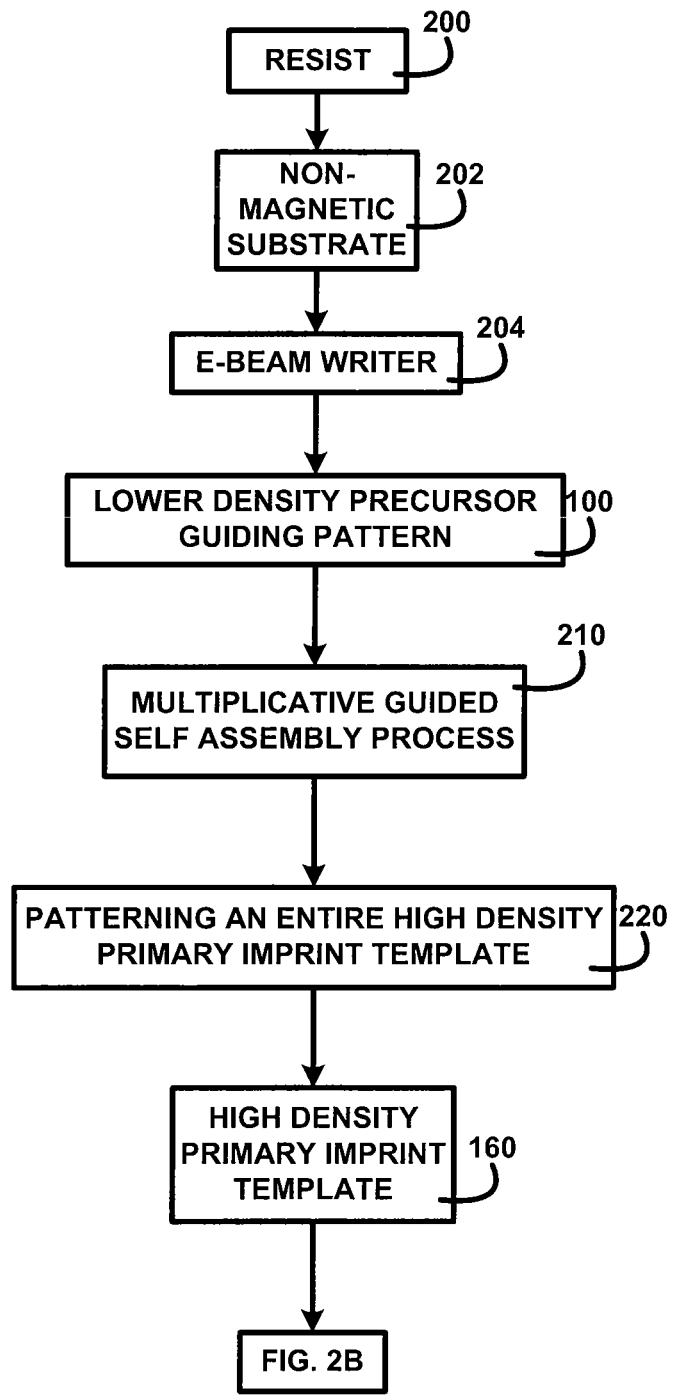
FIG. 2A shows a block diagram of an overview flow chart of a method for patterning a stack of one embodiment.

FIG. 2A shows a block diagram of an overview flow chart of a method for patterning a stack of one embodiment. FIG. 2A shows a time saving step in the method for patterning a stack. The fabrication of the lower density precursor guiding pattern 100 is a layer of spun resist 200 on a non-magnetic substrate 202. The resist is processed with an e-beam writer 204 to pattern a low domain dot density for example 250 Gdpsi. The resist 200 includes for example positive and negative types of resist materials. The positive results in pillars being formed and the negative results in holes or cylindrical recesses. The lower density precursor guiding pattern 100 is the pattern guide for a multiplicative guided self-assembly process 210 such as diblock copolymer. The multiplicative guided self-assembly process 210 doubles the number of dots in both direction thereby quadrupling the density to 1,000 Gdpsi or 1 Tdpsi. The multiplicative guided self-assembly process 210 increases the density patterning an entire high density primary imprint template 220. The high density primary imprint template 160 is used in processes that continue in FIG. 2B. The use of the lower starting dot density reduces the mastering time. The lower density precursor guiding pattern 100 is very uniform and has near perfect symmetry. This method is cost effective and speeds the overall production.

Figure 2B:
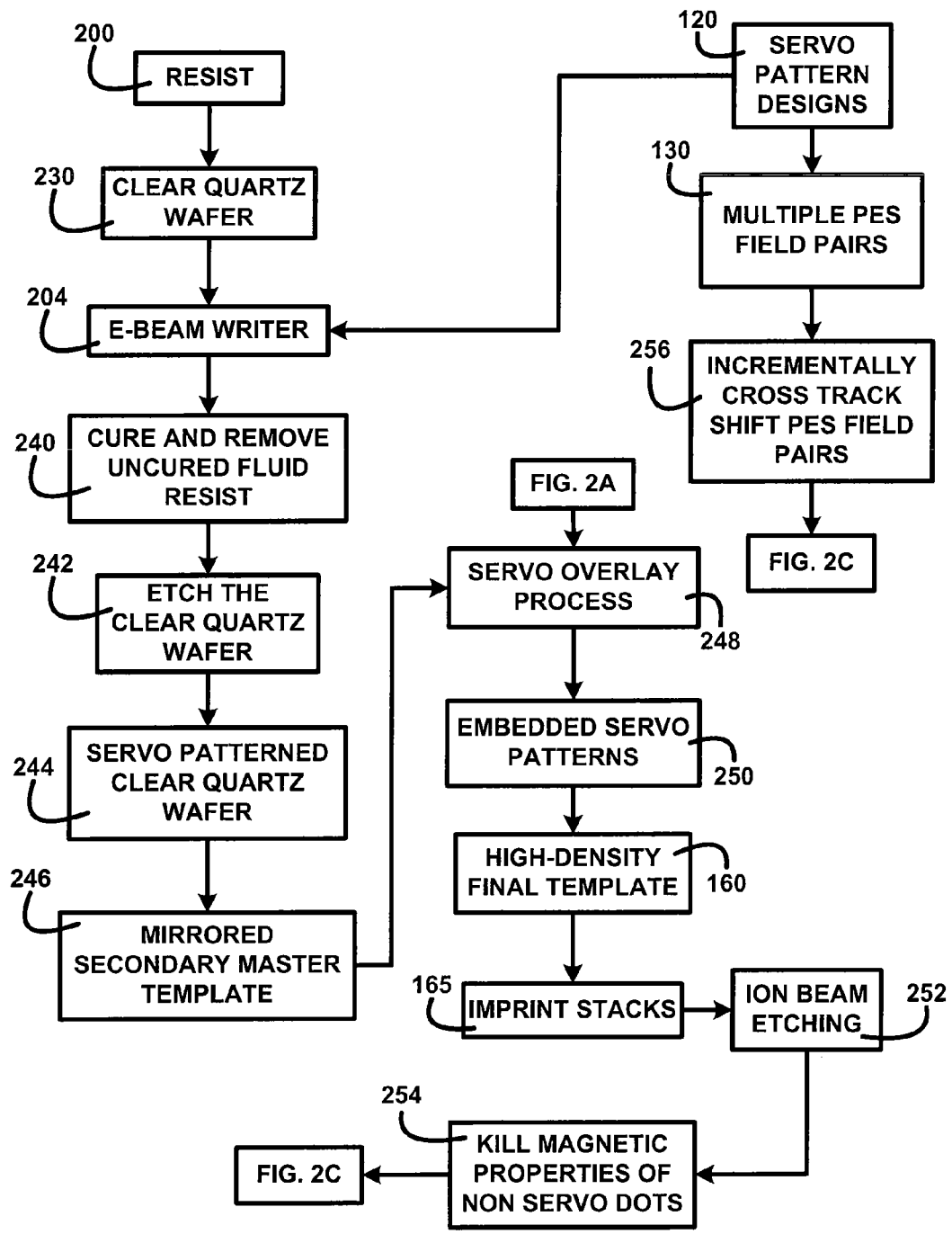
FIG. 2B shows a block diagram of an overview flow chart of a secondary master template of one embodiment.

FIG. 2B shows a block diagram of an overview flow chart of a secondary master template of one embodiment. FIG. 2B shows the separate secondary master template 140 of FIG. 1 being fabricated using spun resist 200 on top of a clear quartz wafer 230. The designed servo patterns 120 are loaded into the e-beam writer 204 to guide the operation. The e-beam writer 204 generates bursts of beams filling the servo patterns and their boundaries onto the resist 200. The electron beams harden the resist duplicating the servo patterns. The area of the resist 200 outside the boundaries of the servo patterns remain fluid. When the e-beam writer 204 has completed patterning the entire clear quartz wafer 230 servo sectors the uncured fluid resist 200 is removed. The surface of the clear quartz wafer 230 is exposed after the removal of the fluid resist 200.

The positions of the servo patterns 120 being processed by the e-beam writer 204 are recorded. The recorded servo pattern designs 120 positioning is used to create multiple PES field pairs 130. The PES field pairs are used to receive the readback signals from areas of the servo patterns. Each pair of the PES field pairs are oriented 90 degrees to one another in relation to the track direction. The positioning of each set of PES field pairs is adjusted to incrementally cross track shift PES field pairs 256. The cross track shift increment includes for example ¼ of the domain dot diameter. Two or more PES field pairs are created including the initial position of the servo patterns used to guide the e-beam writer. The PES field pairs are used in the processes that continue in FIG. 2C.

The e-beam writer 204 and resist 200 lead to the cure and remove uncured fluid resist 240 processes. The surface of the clear quartz wafer 230 is exposed and ready to etch the clear quartz wafer 242. The exposed surface unprotected by the hardened resist 200 is etched using for example ion-beam etching. The hardened resist 200 is removed upon completion to the etching. The topography created by the etching creates a servo patterned clear quartz wafer 244. The servo patterned clear quartz wafer 244 is inverted to form a mirrored secondary master template 246. The previous process in FIG. 2A places the high density primary imprint template 160 of FIG. 1 into a servo overlay process 248.

A layer of resist 200 is spun on top of the high density primary imprint template 160 of FIG. 1. The mirrored secondary master template 246 is set into the resist 200. The etched areas of the inverted mirrored secondary master template 246 are filled by capillary action with the fluid resist 200. The non-etched areas sit on a thin film of the resist 200 close to the surface of the high density primary imprint template 160 of FIG. 1. UV light is projected through the back of the clear quartz wafer 230 to cure and harden the resist 200. The hardened resist is etched. The pillars of the high density primary imprint template 160 of FIG. 1 are etched for example in the low thin film resist 200 areas the pillars are etched to the surface of the non-magnetic substrate 202 of FIG. 2A and the pillars within the servo boundaries are not. This creates the high-density final template 254 for imprinting the embedded servo patterns 250. The high-density final template 254 is used to imprint stacks 165. An ion beam etching 252 process is used to kill magnetic properties of non-servo dots 254 in the imprinted stacks. The imprinted stacks are used in processes that continue in FIG. 2C.

Figure 2C:
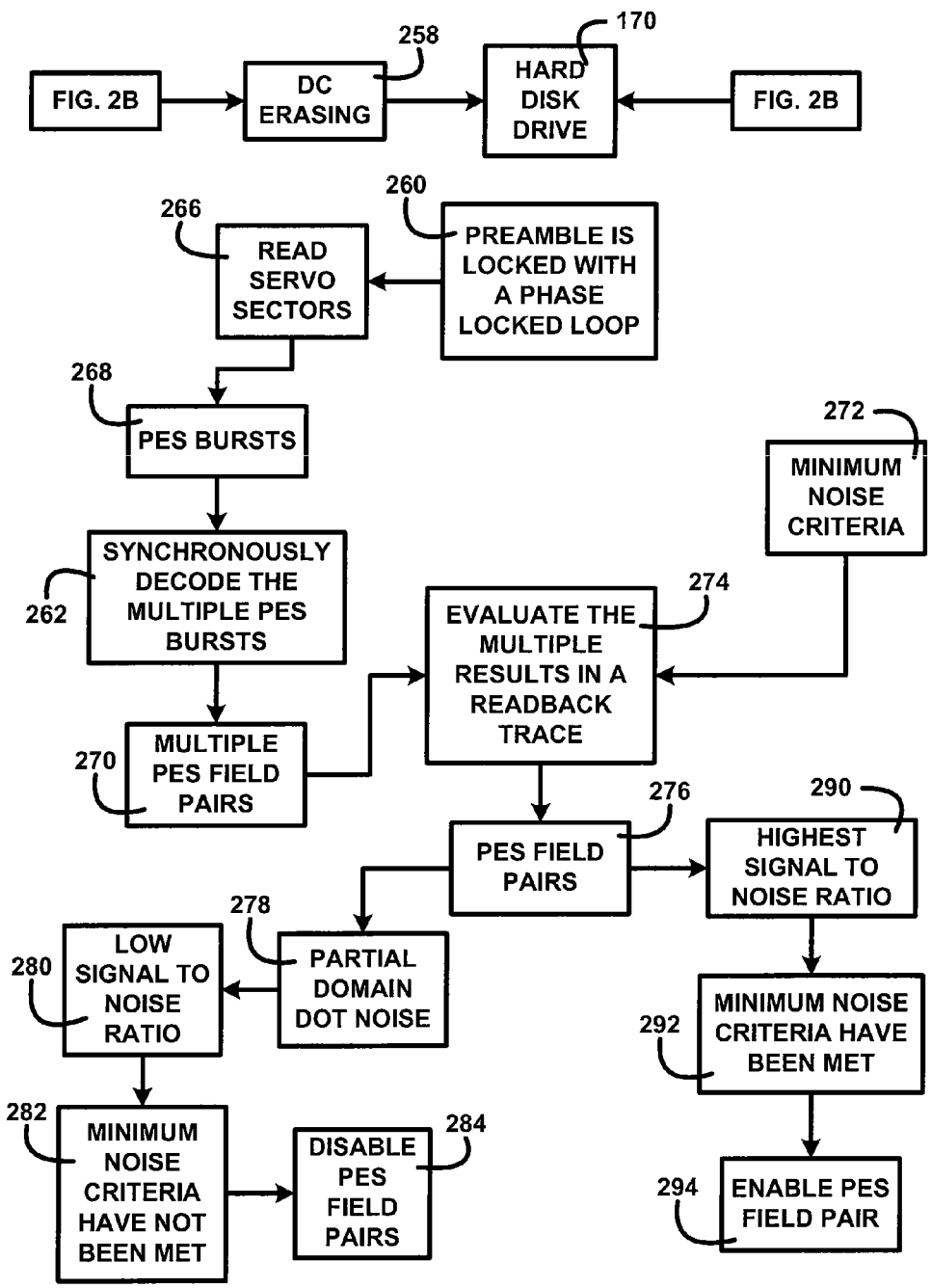
FIG. 2C shows a block diagram of an overview flow chart of a cross track shifting to avoid partial domain dots of one embodiment.

FIG. 2C shows a block diagram of an overview flow chart of a cross track shifting to avoid partial domain dots of one embodiment. FIG. 2C shows the continuation of the processes from FIG. 2B. The imprinted stacks with the embedded servo patterns 250 undergo a constant magnetic field such as DC erasing 258 to realign the magnetic properties in one direction. One or more imprinted stacks are placed into the hard disk drive 170. The multiple PES field pairs 130 including the incrementally cross track shift PES field pairs 256 are set up in the hard disk drive 170. The preamble is locked with a phase locked loop 260 to synchronously decode the multiple PES bursts 262.

The hard disk drive 170 proceeds to read servo sectors 266. The magnetic fields of the domain dots in the servo sectors 266 produces PES bursts 268.

The head in the hard disk drive reads the PES bursts 268 as a readback signal. The multiple PES field pairs 270 receive the readback signals. The electronics in the hard disk drive 170 synchronously decode the multiple PES bursts 262 and readback signals received by the multiple PES field pairs 270. The readback signals are used to evaluate the multiple results in a readback trace 274. Minimum noise criteria 272 are adjustable and established for use in the evaluation. PES burst that are read from domain dots that are crossed by the boundary of a PES field create modulation or partial domain dot noise. The partial domain dot noise 278 received by any of the PES field pairs 276 are registered as a low signal to noise ratio 280. The low signal to noise ratio 280 indicates high partial domain dot noise 278 thereby lowering the ratio. The low signal to noise ratio 280 evaluation is that minimum noise criteria have not been met 282. The position of the PES pair boundary crosses over domain dots creating the partial domain dot noise. Any of the PES pairs where low signal to noise ratio 280 data is received may disable those PES field pairs 284. The multiple PES field pairs positioning having been incrementally cross track shifted may produce at least one pair whose boundaries do not cross over domain dots. The PES field pair that shows the highest signal to noise ratio 290 may indicate that minimum noise criteria have been met 292. The highest signal to noise ratio 290 may enable PES burst pair 294. The selection process of the PES field pair with the highest signal to noise ratio 290 provides accurate position error signals used to reposition the head. This may prevent read errors while using the patterned stack. The method for patterning a stack is a cost effective, time savings and effective method of patterning a stack and increasing production of patterned stacks and media such as bit-patterned media.

Figure 3A:
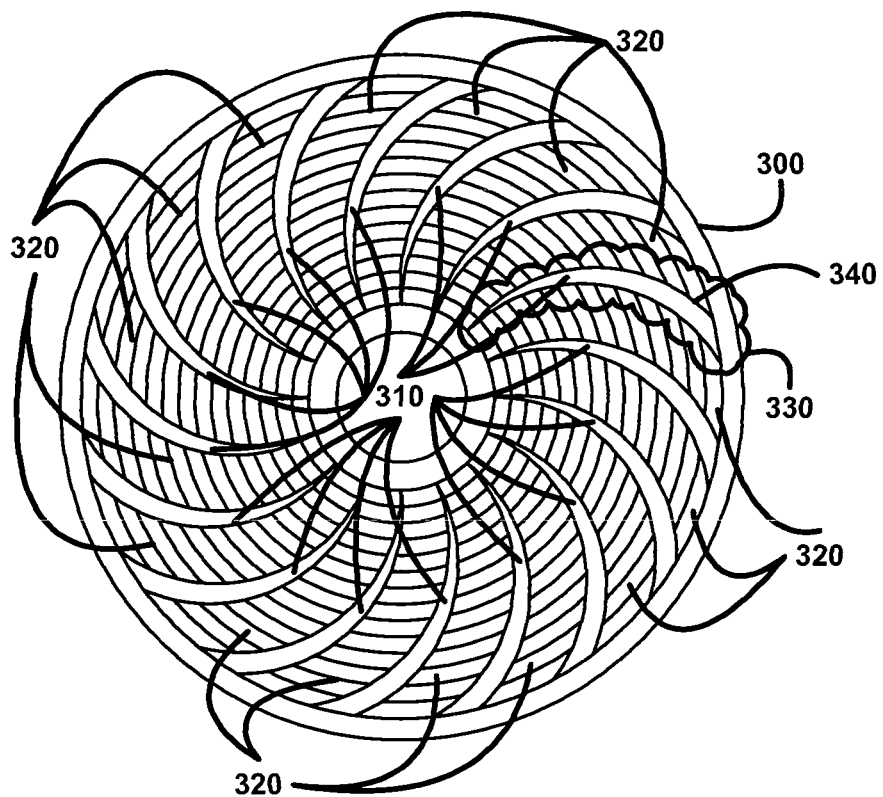
FIG. 3A shows for illustrative purposes only an example of stack servo sectors 310 of one embodiment.

Servo Patterns:

FIG. 3A shows for illustrative purposes only an example of stack servo sectors 310 of one embodiment. The method of patterning a stack 300 is the patterning of the servo sectors 310 of a stack 300. The servo sectors 310 are wedge shaped servo sector 340 areas that project outwardly in a radial position from the center of for example a disk shaped stack 300. The servo sectors 310 are spaced evenly, around the circular stack 300 leaving open other data sectors 320 between servo sectors 310 as shown in FIG. 3A. The wedge shaped servo sectors 310 are islands of domain dots used to store data such as Gray code, SAM and provide PES feedback. The Gray code for example includes 20-bit binary code data used to identify the positions of tracks and sectors. The Gray code is written into the servo sectors 310. The instructions are written into domain dot servo islands located in each track as shown in servo sector detail 330 of FIG. 3B.

Figure 3B:
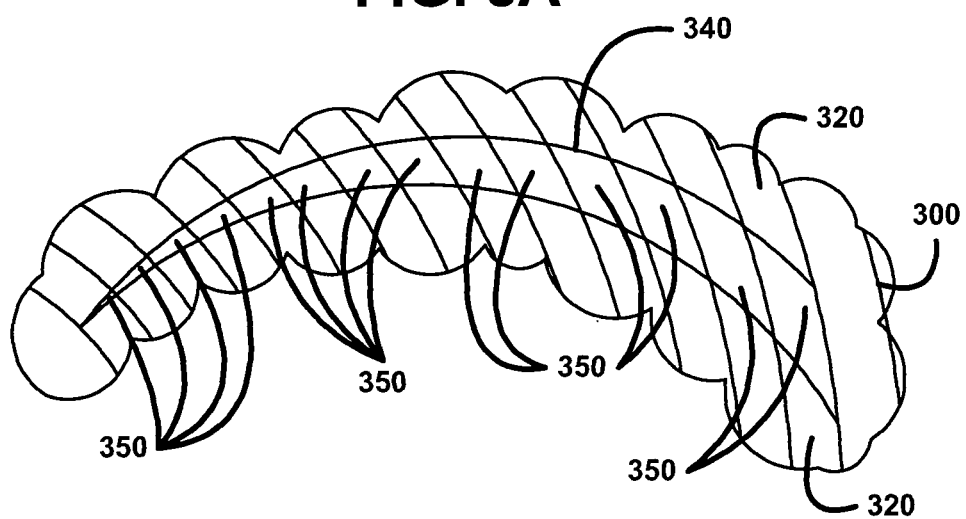
FIG. 3B shows for illustrative purposes only an example of stack 300 servo sections of one embodiment.

FIG. 3B shows for illustrative purposes only an example of stack 300 servo sections of one embodiment. FIG. 3B shows a portion of the stack 300 that is divided into servo sectors 310 and other data sectors 320. The servo sector detail 330 illustrates the wedge shaped servo sector 340 that is divided by the tracks in to multiple servo section 350 regions. The servo patterns are embedded in each servo section 350. The electronics in the hard disk drive use feedback from the heads, which read the Gray code pattern, to very accurately position, and constantly correct the radial position of the appropriate head over the desired track, at the beginning of each servo section 350, to compensate for variations in platter geometry, caused by mechanical stress and thermal expansion and contraction. The PES feedback to the head establish the actual position of the head which is compared to the designed position in the Gray code embedded servo patterns. Partial domain dot noise can increase errors in the reading of the Gray code and PES. Position errors create errors in the search and placement of data which can lead to loss or inaccessibility to retrieve data. A portion of the Gray code is embedded at the start of each sector which is referred to as an embedded servo pattern. The embedded servo pattern data is permanent. The permanent nature of the data thereby means position errors caused by partial domain dot noise can also be permanent. The accuracy of the servo patterns created by the avoided partial domain dot results of the method to pattern a stack 300 provides the permanent position error free environment for this permanent data record on a stack 300.

Figure 4A:
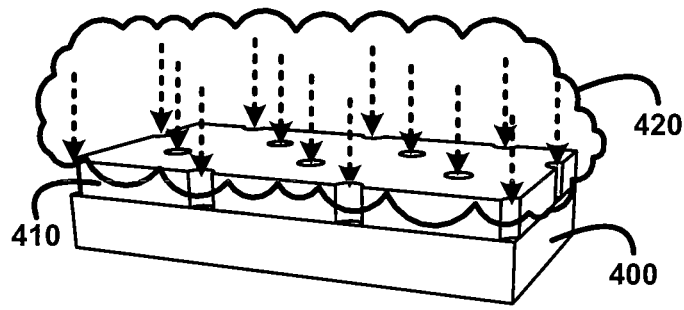
FIG. 4A shows for illustrative purposes only an example of a low domain dot density process of one embodiment.

Low Density Precursor Guiding Pattern:

FIG. 4A shows for illustrative purposes only an example of a low domain dot density process of one embodiment. FIG. 4A shows the non-magnetic substrate 400 on top of which is spun a layer of resist 410. An e beam writer projected electron beams 420 to pattern the resist and substrate.

Figure 4B:
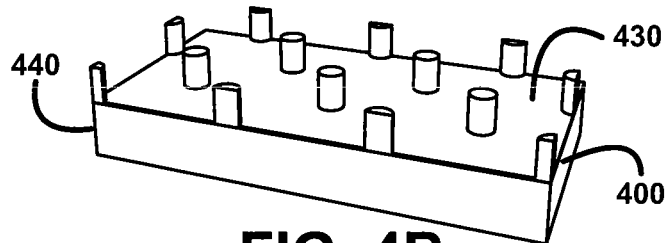
FIG. 4B shows for illustrative purposes only an example of a lower dot density precursor guiding pattern of one embodiment.

FIG. 4B shows for illustrative purposes only an example of a lower dot density precursor guiding pattern of one embodiment. The substrate 410 has a low domain dot density pattern 430 created by the e beam writer. The low domain dot density pattern 430 on the substrate 410 forms a lower dot density precursor guiding pattern 440. The low density precursor guiding pattern 440 density can be for example 250 Gdpsi.

Figure 4C:
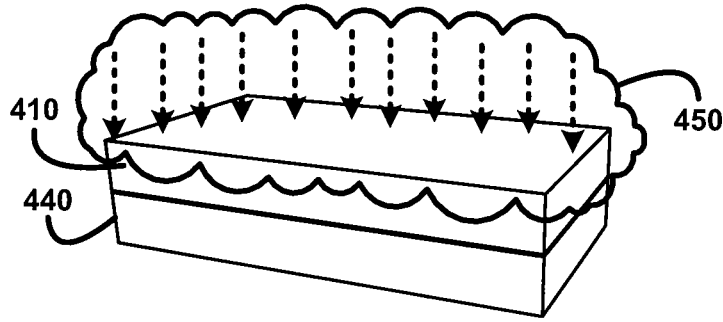
FIG. 4C shows for illustrative purposes only an example of a density multiplicative guided self-assembly process of one embodiment.

Multiplicative Guided Self Assembly:

FIG. 4C shows for illustrative purposes only an example of a density multiplicative guided self-assembly process of one embodiment. On top of the low density precursor guiding pattern 440 is sputtered 450 a clear plastic 410 such as a copolymer for example Polymethyl Methacrylate. The clear plastic 410 chemically treats the dots of the low density precursor guiding pattern 440. The density multiplicative guided self-assembly process doubles the dots in both directions in a hex pattern. The chemically treated dots and structure are baked and the clear plastic is lifted off to reveal the higher density of dots. The multiplicative process such as diblock copolymer doubles the number of dots in both 90 degree directions thereby quadrupling of the density.

Figure 4D:
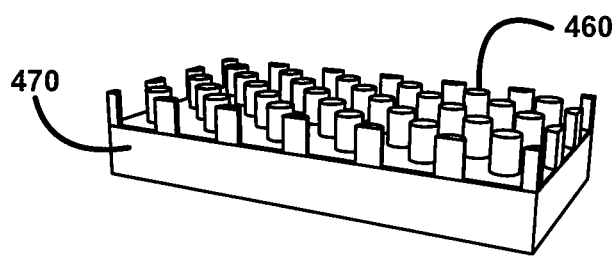
FIG. 4D shows for illustrative purposes only an example of a primary imprint template of one embodiment.

Primary Imprint Template:

FIG. 4D shows for illustrative purposes only an example of a primary imprint template of one embodiment. The results of the guided process using the low dot density precursor guiding pattern 440 of FIG. 4B creates a pattern with higher density 460. The pattern with higher density 460 forms a primary imprint template 470 with a domain dot density for example 1,000 Gdpsi or 1 Tdpsi of one embodiment.

Figure 5A:
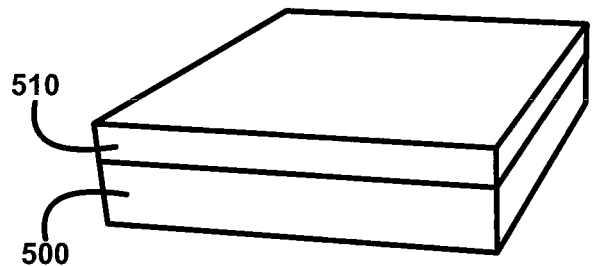
FIG. 5A shows for illustrative purposes only an example of a quartz wafer of one embodiment.

Secondary Master Template:

FIG. 5A shows for illustrative purposes only an example of a quartz wafer of one embodiment. FIG. 5A shows the creation of the separate secondary master template 140. The substrate is a clear quartz wafer 500. Fluid resist 510 is applied over the entire surface of the clear quartz wafer 500.

Figure 5B:
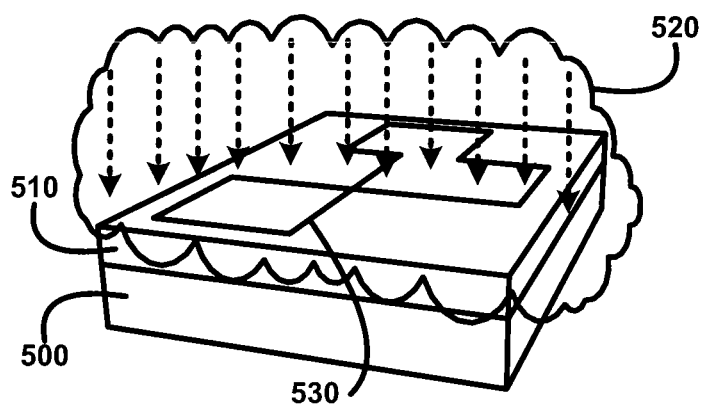
FIG. 5B shows for illustrative purposes only an example of a servo pattern of one embodiment.

FIG. 5B shows for illustrative purposes only an example of a servo pattern of one embodiment. FIG. 5B shows an e beam writer projecting electron beams 520 by following the servo pattern 530. The EBW directs beams 520 in the areas outside of the servo pattern 530 to harden the fluid resist 510 on the clear quartz wafer 500 where wanted according to the servo pattern 530 used to guide the EBW.

Figure 5C:
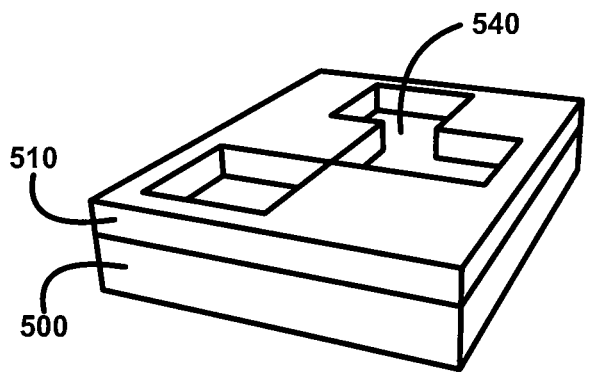
FIG. 5C shows for illustrative purposes only an example of fluid resist removal of one embodiment.

FIG. 5C shows for illustrative purposes only an example of fluid resist removal of one embodiment. The resist 510 in the areas inside the servo pattern 530 is still fluid on the clear quartz wafer 500. The fluid resist 510 is removed with a cleaning process that washes away the still fluid resist 510. This leaves the surface of the clear quartz wafer 500 uncovered in the non-hardened resist areas 540.

Figure 5D:
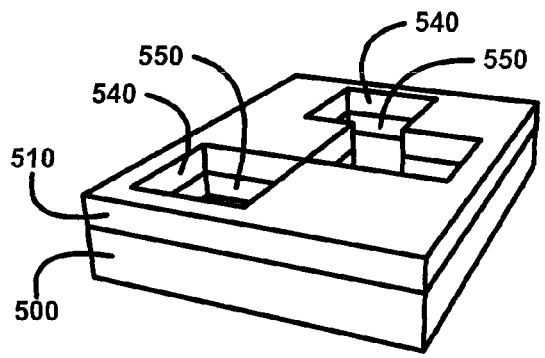
FIG. 5D shows for illustrative purposes only an example of etching a quartz wafer of one embodiment.

FIG. 5D shows for illustrative purposes only an example of etching a quartz wafer of one embodiment. FIG. 5D shows the resist 510 was removed from the non-hardened resist areas 540 of the clear quartz wafer 500. The surface of the clear quartz wafer 500 is etched 550 removing a portion of the quartz material inside the servo pattern 530 areas.

Figure 5E:
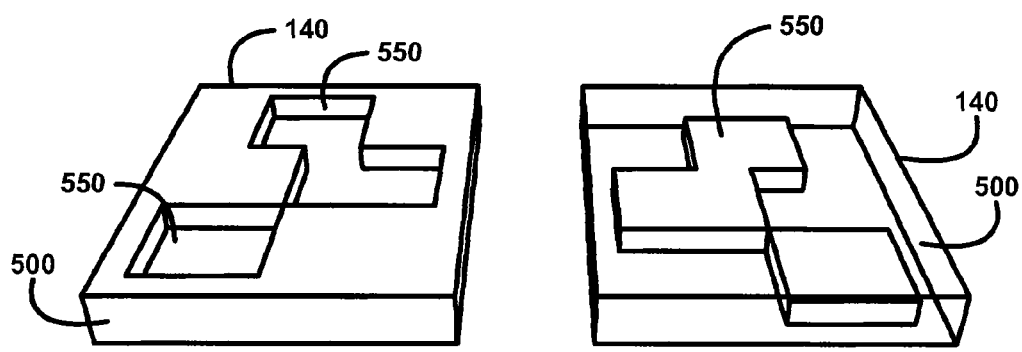
FIG. 5E shows for illustrative purposes only an example of a secondary master template of one embodiment.

FIG. 5E shows for illustrative purposes only an example of a secondary master template of one embodiment. FIG. 5E shows the hardened resist 510 is removed. This leaves topography of lower etched 550 servo pattern island areas and raised areas on the clear quartz wafer 500 surfaces of the secondary master template 140 in the servo sectors. The secondary master template is inverted to use in a servo overlay process of one embodiment.

Figure 6A:
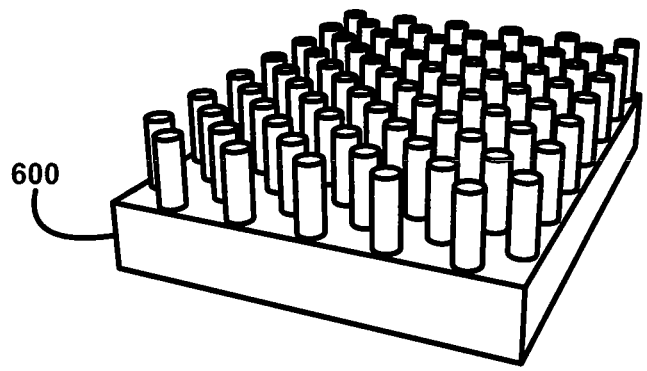
FIG. 6A shows for illustrative purposes only an example of a primary imprint template of one embodiment.

Servo Overlay Process:

FIG. 6A shows for illustrative purposes only an example of a primary imprint template of one embodiment. The servo overlay process 150 of FIG. 1 begins with a primary imprint template 600. The primary imprint template 600 has a high domain dot density such as 1 Tdpsi.

Figure 6B:
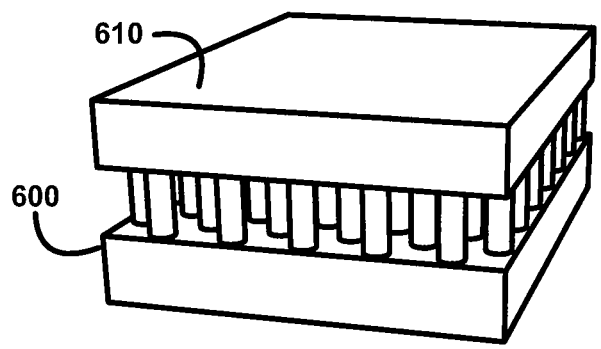
FIG. 6B shows for illustrative purposes only an example of an overlay resist layer of one embodiment.

FIG. 6B shows for illustrative purposes only an example of an overlay resist layer of one embodiment. On top of the primary imprint template 600 is spun an overlay resist layer 610. The overlay resist layer 610 is spun with sufficient volume to fill the etched areas of a secondary master template 140 of FIG. 1.

Figure 6C:
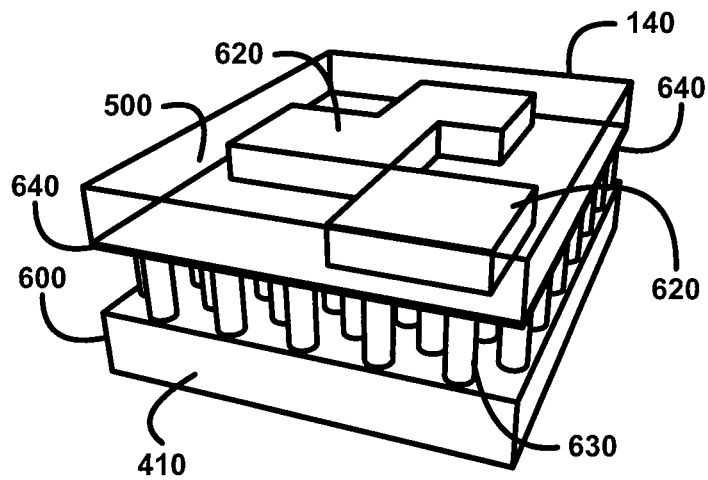
FIG. 6C shows for illustrative purposes only an example of a servo overlay process of one embodiment.

FIG. 6C shows for illustrative purposes only an example of a servo overlay process of one embodiment. Set into the overlay resist layer 610 spun on top of the primary imprint template 600 is the secondary master template 140. The secondary master template 140 is inverted to create a mirrored image of the servo patterns 620 etched into the surface of the clear quartz wafer 500 surface. The fluid resist fills the etched areas by capillary action. The resist pressed by the bottom surface of the secondary master template 140 forms a thin film 640. FIG. 6C shows in the illustration the front side of the primary imprint template 600 transparent to reveal the pillar structure 630 of the domain dots on top of the substrate 410.

Figure 6D:
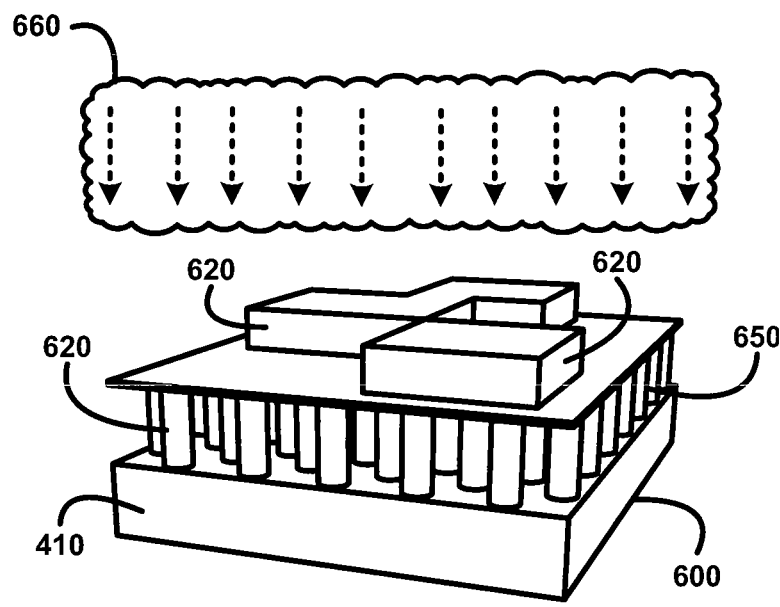
FIG. 6D shows for illustrative purposes only an example of a quartz wafer of one embodiment.

FIG. 6D shows for illustrative purposes only an example of a quartz wafer of one embodiment. The overlay resist layer 610 has filled the etched areas of the mirrored servo patterns. Ultra violet (UV) light 660 is projected through the back of the clear quartz secondary master template 140 of FIG. 1. The UV light 660 sets or cures the resist forming a hard resist layer with the mirrored topography of the secondary master template 620. The UV light 660 sets or cures the resist thin film 640 that is in contact with the surface of the primary imprint template 600 with the pillar structure 630 of the domain dots and primary imprint template hardened resist 650 on top of the substrate 410.

Figure 6E:
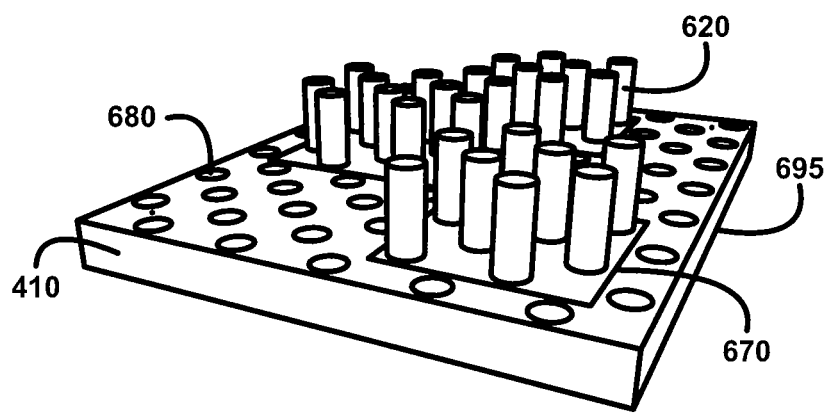
FIG. 6E shows for illustrative purposes only an example of a high density final template of one embodiment.

High Density Final Template:

FIG. 6E shows for illustrative purposes only an example of a high density final template of one embodiment. Ion beam etching is used to remove the hardened overlay resist layer 610. The Ion beam etching also removes the pillar structure 630 material that forms the domain dots under the thin film 640 of resist. The thicker raised mirrored topography of the secondary master template 620 is not removed. The high density final template 695 is used to imprint stacks 165 of FIG. 1 of one embodiment.

Figure 7A:
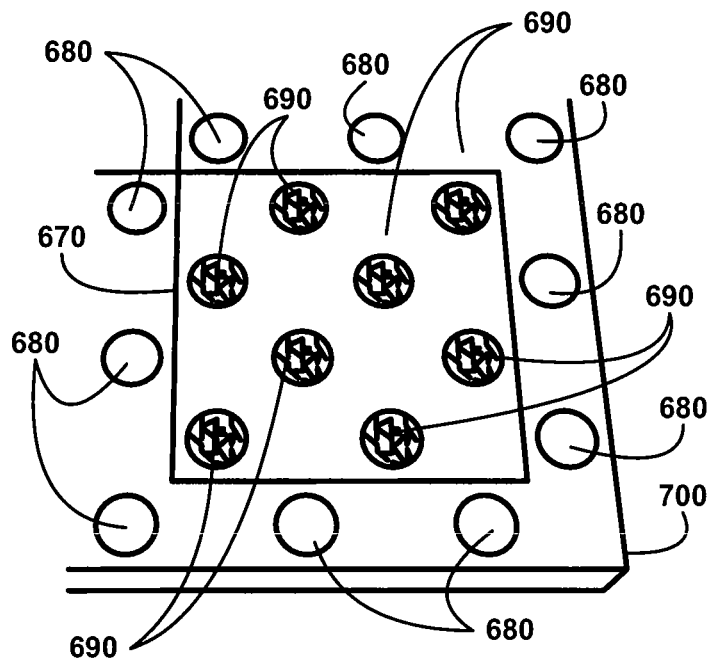
FIG. 7A shows for illustrative purposes only an example of unaligned domain dots of one embodiment.

DC Erasing:

FIG. 7A shows for illustrative purposes only an example of unaligned domain dots of one embodiment. FIG. 7A shows a patterned stack servo section 700. The patterned stack servo section 700 includes the killed dots 680 with magnetic properties removed by ion beams. The patterned stack servo section 700 indicates the servo pattern boundary 670 within which there are domain dots with non-realigned magnetic fields 690. The domain dots with non-realigned magnetic fields 690 are characterized by magnetic properties that are cancelling each other or producing random results. The magnetic fields are realigned using a constant magnetic field as shown in FIG. 7B of one embodiment.

Figure 7B:
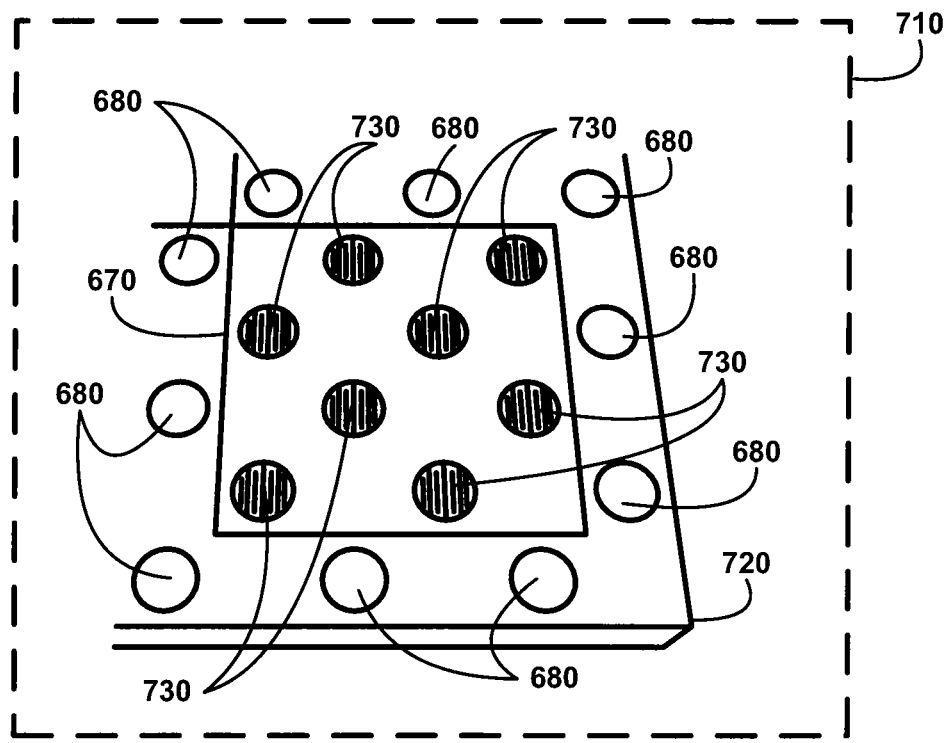
FIG. 7B shows for illustrative purposes only an example of DC erasing of one embodiment.

FIG. 7B shows for illustrative purposes only an example of DC erasing of one embodiment. FIG. 7B shows the patterned stack servo section 700. The patterned stack servo section 700 includes the killed dots 680 with magnetic properties removed by ion beams. The patterned stack servo section 700 indicates the servo pattern boundary 670 within which there are pillar structured domain dots. The patterned stack servo section 700 is placed in a constant magnetic field such as DC erasing 710. The domain dots with non-re-aligned magnetic fields 690 of FIG. 7A are effected by the constant magnet field and the magnetic properties are realigned in one direction and restore clear magnetic responses. The domain dots with magnetic fields realigned 730 then have magnetic properties that can be used for read write operations. This process produces a DC erased patterned stack servo section 720. The DC erased patterned stack servo section 720 realignment is produced on the entire stack. After DC erasing 710 the stack for example a bit-patterned media can be placed in a hard disk drive for read write operations of one embodiment.

Figure 8:
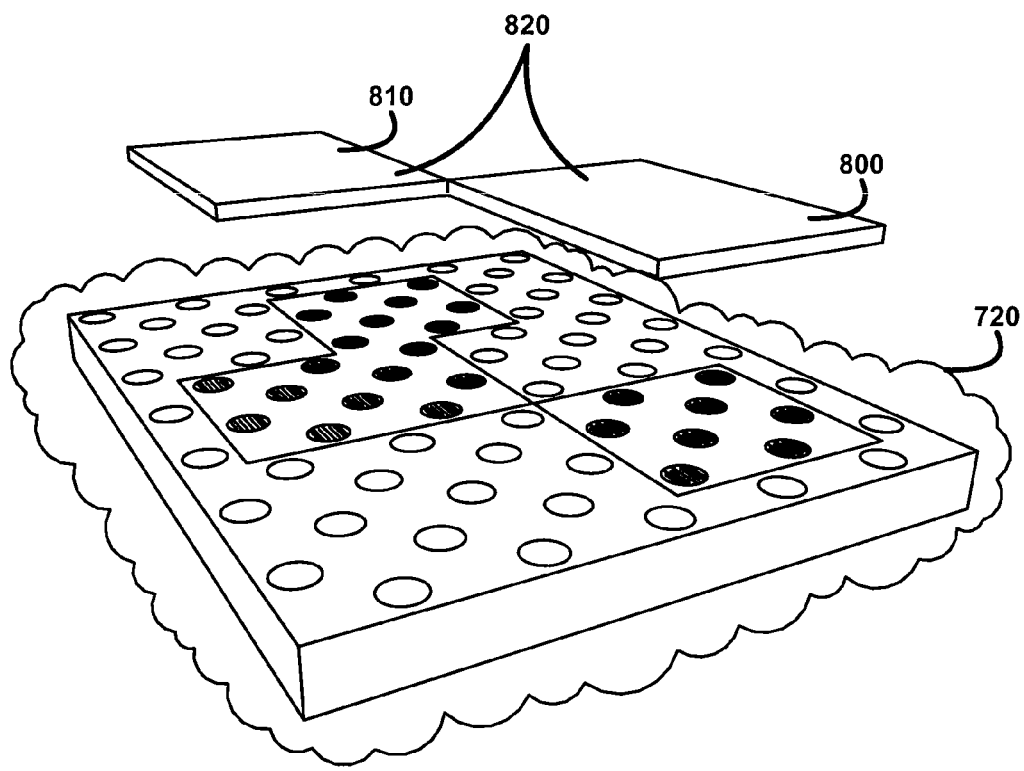
FIG. 8 shows for illustrative purposes only an example of position error signal (PES) fields of one embodiment.

PES Fields:

FIG. 8 shows for illustrative purposes only an example of PES fields of one embodiment. FIG. 8 shows the relative position of the PES fields to the DC erased patterned stack servo section 720. During the process to create the secondary master template 140 of FIG. 1 the EBW the multiple PES fields are established. The PES fields are electronic device in the head. A PES field A 800 is combined with a PES field B 810 set at 90 degrees from PES field A 800 from to form a PES field pair 820. The position of the PES field pair 820 is over the DC erased patterned stack servo section 720 to register readback from positioning bursts made during read write operations of one embodiment.

Figure 9A:
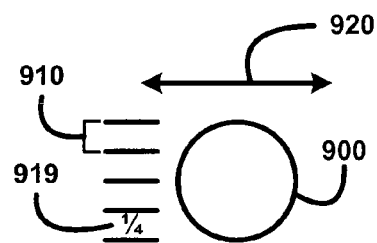
FIG. 9A shows for illustrative purposes only an example of a cross track shift increment of one embodiment.

Cross Track Shift Increment:

FIG. 9A shows for illustrative purposes only an example of a cross track shift increment of one embodiment. FIG. 9A shows a domain dot 900 such as those on the DC erased patterned stack servo section 720 of FIG. 7B. Two or more sets of PES fields are defined to register the readback signals received from the servo sections 350 of FIG. 3B. The positioning of each set of PES field pairs is shifted across a track direction 920 using a shift distance equal to one cross track shift increment 910. The cross track shift increment 910 is adjustable and includes for example a one-quarter (¼) 919 domain dot 900 diameter increment of one embodiment.

Figure 9B:
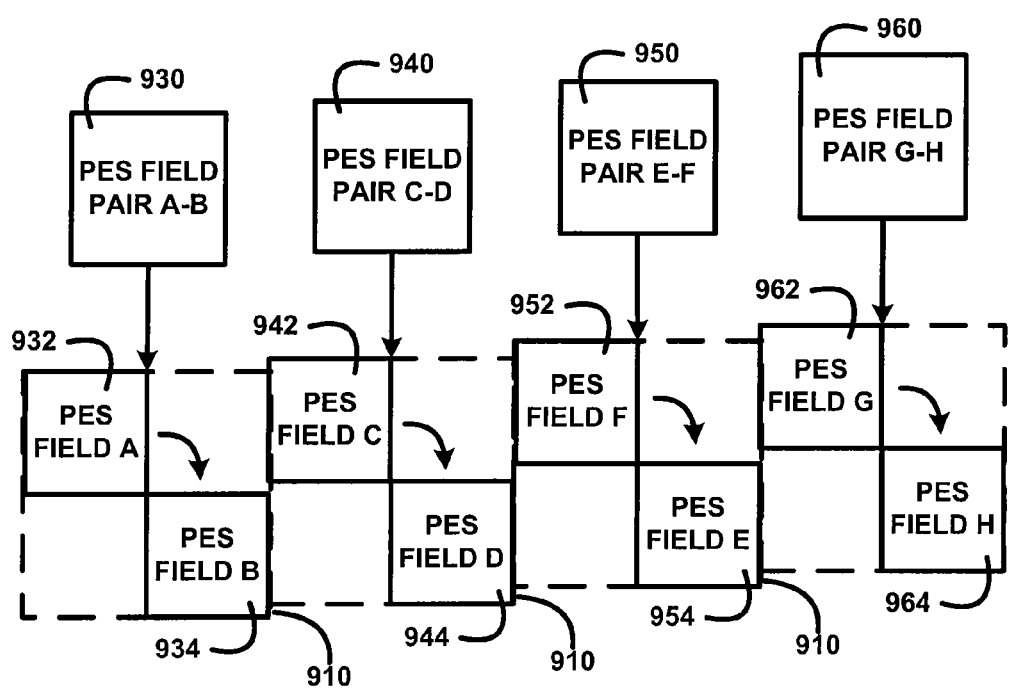
FIG. 9B shows for illustrative purposes only an example of the incremental cross track shifting of one embodiment.

Incremental Cross Track Shifting:

FIG. 9B shows for illustrative purposes only an example of the incremental cross track shifting of one embodiment. The creation of the secondary master template 140 of FIG. 1 includes during the servo pattern designs 120 positioning using the e beam writer 204 of FIG. 2A the positions of the PES fields are recorded. The position of the initial PES field pair A-B 930 is the position of the servo pattern. Additional PES field pairs are shifted in the radial direction across the track direction 920 of FIG. 9A by one cross track shift increment 910.

FIG. 9B shows four PES field pairs PES field pair A-B 930, PES field pair C-D 940, PES field pair E-F 950, and PES field pair G-H 960. PES field pair A-B 930 is a set of two field pairs PES field A 932 and the second set at a 90 degree orientation from the first PES field B 934. PES field pair A-B 930 is positioned at the initial servo pattern position. PES field pair C-D 940 is a set of two field pairs PES field C 942 and the second set at a 90 degree orientation from the first PES field D 944. PES field pair C-D 940 is positioned one cross track shift increment 910 from PES field pair A-B 930. PES field pair E-F 950 is a set of two field pairs PES field E 952 and the second set at a 90 degree orientation from the first PES field F 954. PES field pair E-F 950 is positioned one cross track shift increment 910 from PES field pair C-D 940. PES field pair G-H 960 is a set of two field pairs PES field G 962 and the second set at a 90 degree orientation from the first PES field H 964. PES field pair G-H 960 is positioned one cross track shift increment 910 from PES field pair E-F 950.

The initial servo pattern positioned PES field pair A-B 930 may or may not have boundaries that cross over a domain dot 900 of FIG. 9A. If it does it may receive partial domain dot noise. The PES field pairs positioned cross track by one cross track shift increment 910 may or may not receive partial domain dot noise. Minimum noise criteria is adjustable and for example evaluate partial domain dot noise that is generated by a percentage=>75% of the dot is exposed to a burst to be unacceptable or by a percentage<50% of the dot is exposed to a burst (the sweet spot) is exposed it does not register and is acceptable. The cross track shifting may allow selection of the PES field pair that records the highest signal to noise ratio indicating avoided partial domain dot noise of one embodiment.

Figure 10:
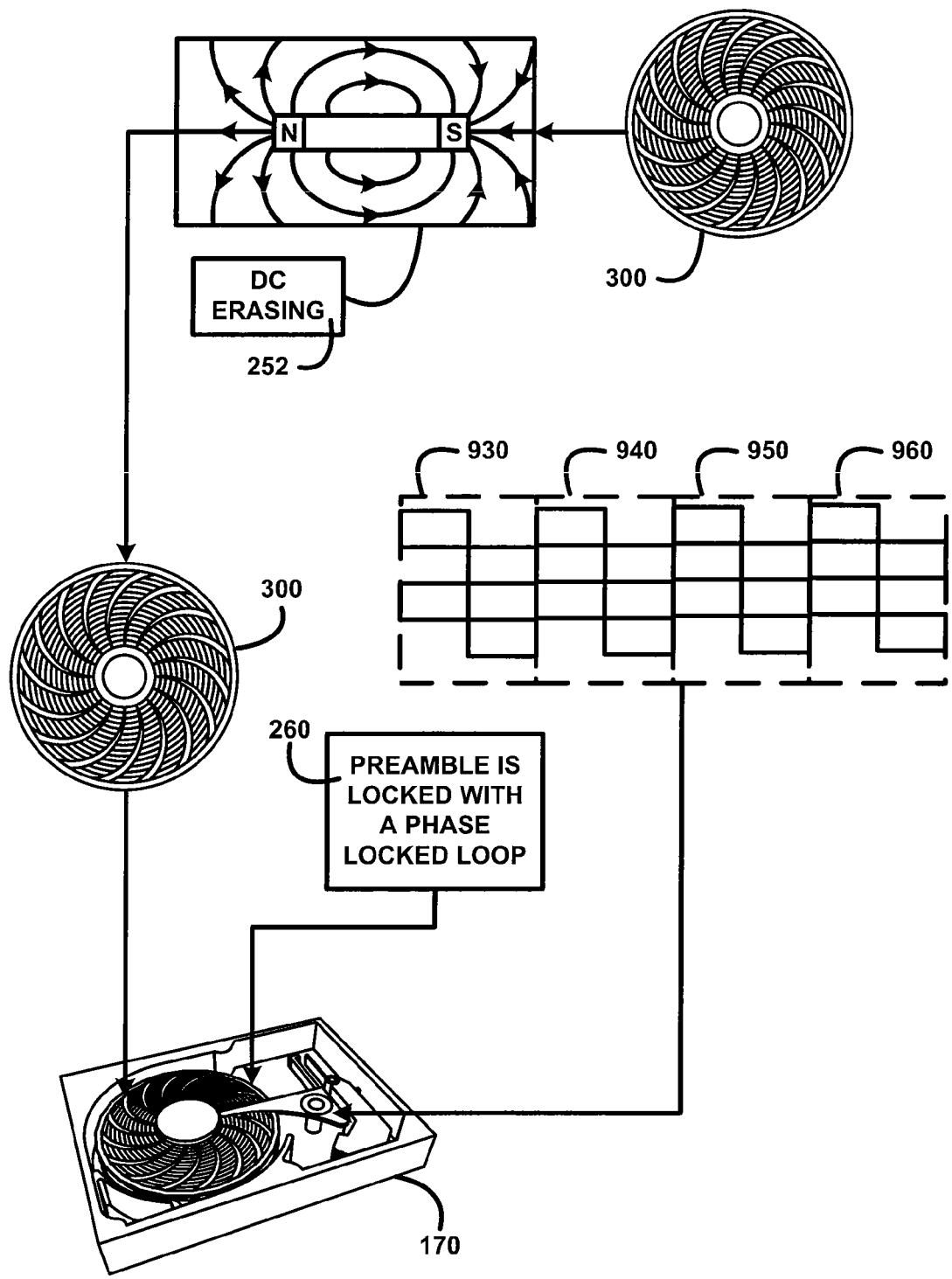
FIG. 10 shows for illustrative purposes only an example of servo sector reading of one embodiment.

Servo Sector Reading:

FIG. 10 shows for illustrative purposes only an example of servo sector reading of one embodiment. FIG. 10 shows the stack 300 patterned using the high density final template 160 of FIG. 1 and configured as a stack disk placed in the hard disk drive 170. The head of the hard disk drive 170 includes the four PES field pairs including PES field pair A-B 930, PES field pair C-D 940, PES field pair E-F 950 and PES field pair G-H 960. The preamble is locked with a phase locked loop 260 to allow synchronous decoding of the PES burst signals. The continuous servo patterning 264 process begins to read the head position using the information in the servo sectors 310 of FIG. 3A of one embodiment.

Figure 11A:
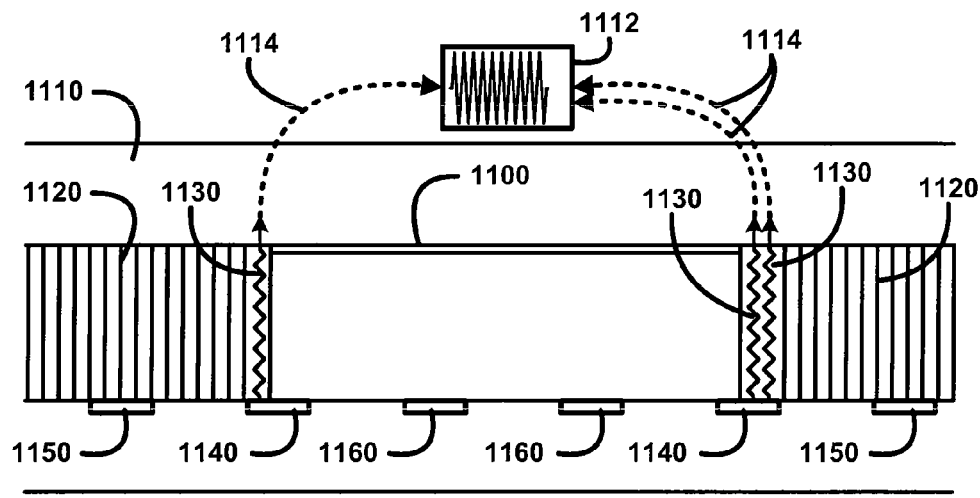
FIG. 11A shows for illustrative purposes only an example of partial dot noise of one embodiment.

FIG. 11A shows for illustrative purposes only an example of partial dot noise of one embodiment. The stack 300 of FIG. 3A has been put into the hard disk drive 170 of FIG. 1. The mechanical systems 1110 in the hard disk drive 170 of FIG. 1 reads a PES burst 1120. The head in the hard disk drive 170 serially reads the magnetic fields of the dots in the embedded servo pattern designs in the servo sectors. The magnetic fields are referred to as "servo bursts". The dots that have been killed emit a weak magnetic field that is flipping and these create a white noise that is registered in the readback trace. Partial domain dots of crossed by the PES field boundaries increase the level of noise in addition to the white noise. The PES burst 1120 produces a position error signal (PES). The PES is received by the multiple PES field pairs 130 of FIG. 1. The 90 degree orientation of the PES field pair provides the trigonometric sine and cosine values of the PES. Those values are synchronously decoded and recorded in a readback trace 1112. The PES bursts cause a magnetic response in the domain dots. The PES received by a PES field pair 1100 may generate partial domain dot noise 1130 if the boundary of the PES field pair crosses a domain dot 1140. Partial domain dot noise 1130 may register a low signal to noise ratio on the readback trace 1112 which may indicate a high level of partial domain dot noise 1130. When the boundary of the PES field pair 1100 does not cross a domain dot 1160 or the PES field pair 1100 does not extend over a domain dot 1150 no partial domain dot noise 1130 is registered. The readback trace synchronously received data is used to turn off those PES field pairs that receive low signal to noise ratios indicating partial dot erasures.

Figure 11B:
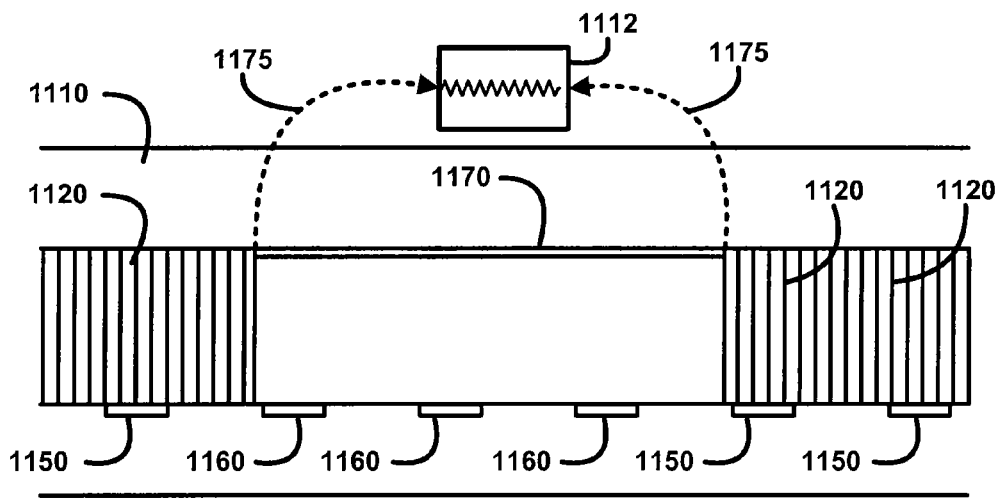
FIG. 11B shows for illustrative purposes only an example of avoided partial dot noise of one embodiment.

FIG. 11B shows for illustrative purposes only an example of avoided partial dot noise of one embodiment. The mechanical systems 1110 in the hard disk drive 170 of FIG. 1 generate a PES burst 1120. The PES burst 1120 produces a position error signal (PES). The PES is received by the multiple PES field pairs 130 of FIG. 1. The 90 degree orientation of the PES field pair provides the trigonometric sine and cosine values of the PES. Those values are synchronously decoded and recorded in a readback trace 1112. The PES bursts cause a magnetic response in the domain dots.

The position of the PES field pairs 1170 in FIG. 11B has been cross track shifted by 3 units of the cross track shift increment 910 of FIG. 9A. The cross track shifting has aligned the boundaries of the PES field pairs 1170 to avoid crossing a domain dot 1160. The avoidance of a partial domain dot eliminates or reduces the partial domain dot noise 1130 of FIG. 11A. The lower level of noise received in the readback trace 1112 may produce the highest signal to noise ratio. The readback trace synchronously received data is used to turn off those PES field pairs that receive low signal to noise ratios indicating partial dot erasures. In the example shown in FIG. 11B the PES field pairs 1170 may not be turned off. The cross track shifting avoids partial domain dot noise 1130 of FIG. 11A and the PES information may provide accurate positioning of the head using the data in the servo sectors.

Figure 12:
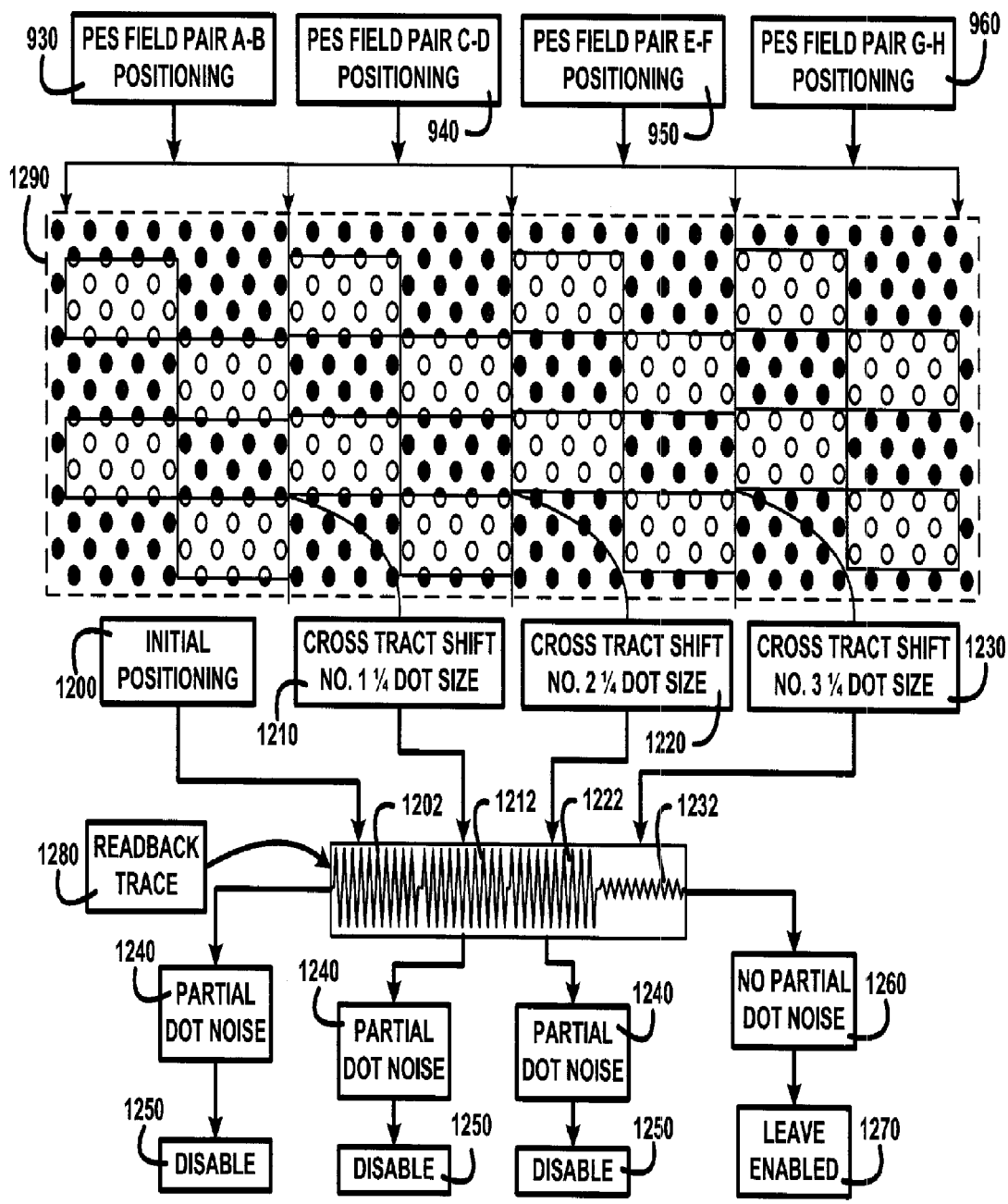
FIG. 12 shows for illustrative purposes only an example of a cross track shifted PES field pairs operation of one embodiment.

Cross Track Shifted PES Field Pairs Operation:

FIG. 12 shows for illustrative purposes only an example of a cross track shifted PES field pairs operation of one embodiment. FIG. 12 shows for example four PES field pairs including PES field pair A-B 930, PES field pair C-D 940, PES field pair E-F 950 and PES field pair G-H 960. The domain dot zones from which the PES field pair receives the PES lie along a track. PES field pair A-B 930 is in the initial positioning 1200. The pair boundaries cross over domain dots. The PES signals received by four PES field pairs are synchronously decoded and recorded in the readback trace 1280.

The PES signals received by PES field pair A-B 930 indicates increased levels 1202 of partial dot noise 1240. This may cause a low signal to noise ratio. The electronic systems in the hard disk drive 170 of FIG. 1 may disable 1250 PES field pair A-B 930.

PES field pair C-D 940 is in a position that includes cross tract shift no. 1¼ dot size 1210. This one unit of the cross track shift increment 910 of FIG. 9A shift positions the boundaries so that they also cross over domain dots. The PES signals received by PES field pair C-D 940 indicates increased levels 1212 of partial dot noise 1240. This may cause a low signal to noise ratio. The electronic systems in the hard disk drive 170 of FIG. 1 may disable 1250 PES field pair C-D 940.

PES field pair E-F 950 is in a position that includes cross tract shift no. 2¼ dot size 1220. This two unit of the cross track shift increment 910 of FIG. 9A shift positions the boundaries so that they also cross over domain dots. The PES signals received by PES field pair E-F 950 indicates increased levels 1222 of partial dot noise 1240. This may cause a low signal to noise ratio. The electronic systems in the hard disk drive 170 of FIG. 1 may disable 1250 PES field pair E-F 950.

PES field pair G-H 960 is in a position that includes cross tract shift no. 3¼ dot size 1230. This three unit of the cross track shift increment 910 of FIG. 9A shift positions the boundaries so that they do not cross over domain dots. The PES signals received by PES field pair G-H 960 indicates decreased noise levels 1232 indicating partial dot noise 1240 has been avoided. This may cause a high signal to noise ratio. The electronic systems in the hard disk drive 170 of FIG. 1 may leave enabled 1270 PES field pair G-H 960.

The operations and results of the cross track shifting provide accurate positioning of the head using the information recorded in the servo sectors 310 of FIG. 3A. The method for patterning a stack reduces mastering time in a cost effective manner. The time and cost saved and the increased accuracy creates increased production of quality patterned stacks.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method, comprising:
    forming an initial template comprising an initial pattern;
    forming a first template from the initial template, wherein
        forming the first template includes self-assembly of diblock copolymers guided by the initial pattern, and
        the first template comprises a first pattern having a uniform symmetry of dots in a pillar structure and a greater pattern density of the dots than the initial pattern;
    forming a second template comprising a second pattern corresponding to a servo pattern for a recording medium; and
    forming a master template from the first template, wherein
        forming the master template includes
            spinning resist onto the dots of the first pattern of the first template,
            imprinting the resist with the second template to form thin resist and thick resist over the pillar structure,
            curing the thin resist and the thick resist, and
            etching the thin resist and the thick resist and the pillar structure to remove the pillar structure under the thin resist to form portions of the first pattern combined with the second pattern.

2. The method of claim 1,
    wherein forming the initial template comprises spinning resist onto a first substrate and subsequently writing the initial pattern with an electron-beam writer.

3. The method of claim 2,
    wherein the initial pattern comprises a pattern density of 250 Gdpsi.

4. The method of claim 1,
    wherein the first pattern comprises a pattern density of 1 Tdpsi.

5. The method of claim 1,
    wherein forming the second template comprises spinning resist onto a second substrate and subsequently writing the second pattern with an electron-beam writer.

6. The method of claim 5,
    wherein the second pattern comprises a mirror image of the servo pattern for the master template.

7. A method, comprising:
    forming a first template from an initial template,
        wherein the first template comprises a first pattern at about a 1-Tdpsi pattern density with a uniform symmetry of pillar structured dots;
    forming a second template,
        wherein the second template comprises a second pattern corresponding to a servo pattern for a recording device; and
    forming a master template from the first template, wherein
        forming the master template includes
            spinning resist onto the pillar structured dots,
            imprinting the resist with the second template to form thin resist and thick resist over the pillar structured dots,
            curing the thin resist and the thick resist, and
            etching the thin resist and the thick resist and the pillar structured dots to remove the pillar structured dots under the thin resist to form portions of the first pattern combined with the second pattern.

8. The method of claim 7, further comprising,
    forming the initial template,
        wherein forming the initial template comprises spinning resist onto a first substrate and subsequently electron-beam writing an initial pattern at a 250-Gdpsi pattern density.

9. The method of claim 7,
    wherein forming the first template comprises self-assembly of diblock copolymers guided by the initial pattern.

10. The method of claim 9,
    wherein forming the second template comprises spinning resist onto a second substrate and subsequently writing the second pattern with an electron-beam writer.

11. The method of claim 10,
    wherein the second pattern comprises a mirror image of the servo pattern for the master template.

12. A method, comprising:
    forming a first template comprising a first pattern of pillar structures with a uniform symmetry,
        wherein forming the first template comprises self-assembly of diblock copolymers guided by an initial pattern;
    forming a second template comprising a second pattern,
        wherein the second pattern corresponds to a servo pattern; and forming a master template from the first template,
wherein
  forming the master template includes
    spinning resist onto the pillar structures,
    imprinting the resist with the second template to form thin resist and thick resist over the pillar structures, and
    etching the thin resist and the thick resist and the pillar structures to remove the pillar structures under the thin resist to form portions of the first pattern combined with the second pattern.

13. The method of claim 12, further comprising,
forming the initial pattern,
  wherein forming the initial pattern comprises spinning resist onto a first substrate and subsequently electron-beam writing the initial pattern at a 250-Gdpsi pattern density.

14. The method of claim 13,
wherein the first pattern comprises a pattern density of 1 Tdpsi.

15. The method of claim 14,
wherein forming the second template comprises spinning resist onto a second substrate and subsequently writing the second pattern with an electron-beam writer.

16. The method of claim 15,
wherein the first pattern combined with the second pattern comprises hexagonally patterned pillars in a servo pattern for bit-patterned media.

* * * * *

UNITED STATES PATENT AND TRADEMARK OFFICE
CERTIFICATE OF CORRECTION

PATENT NO. : 9,905,259 B2
APPLICATION NO. : 14/699412
DATED : February 27, 2018
INVENTOR(S) : Sundeep Chauhan et al.

It is certified that error appears in the above-identified patent and that said Letters Patent is hereby corrected as shown below:

On the Title Page

Item (72), sixth inventor's Name:
"Barmeshwar Vikaramaditya" should be listed as --Barmeshwar Vikramaditya--

Signed and Sealed this
Second Day of October, 2018

Andrei Iancu
*Director of the United States Patent and Trademark Office*